United States Patent
Wang et al.

(10) Patent No.: US 6,211,021 B1
(45) Date of Patent: Apr. 3, 2001

(54) METHOD FOR FORMING A BORDERLESS CONTACT

(75) Inventors: Chuan-Fu Wang, Taipei Hsien; Horng-Nan Chern, Tainan Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/360,754

(22) Filed: Jul. 26, 1999

(51) Int. Cl.$^7$ .................................................. H01L 21/336
(52) U.S. Cl. ........................ 438/296; 438/294; 438/424; 438/524
(58) Field of Search ............................... 438/197, 294, 438/308, 524, 526, 424, 296

(56) References Cited

U.S. PATENT DOCUMENTS

| | | | |
|---|---|---|---|
| 5,316,965 | * 5/1994 | Philipossian et al. | 148/DIG. 50 |
| 5,804,862 | * 9/1998 | Matumoto | 257/396 |
| 5,880,006 | * 3/1999 | Lin et al. | 438/424 |
| 5,902,127 | * 11/1999 | Park | 438/435 |
| 6,051,472 | * 4/2000 | Abiko et al. | 438/296 |

* cited by examiner

Primary Examiner—Trung Dang
(74) Attorney, Agent, or Firm—Thomas, Kayden, Horstemeyer & Risley

(57) ABSTRACT

A method of forming a borderless contact is described. An ion implantation process and a thermal process are performed on a device isolation structure to form a silicon nitride layer therein. During a process of forming a borderless contact window, the silicon nitride layer can serve as an etching stop layer to protect the device isolation structure from overetching. As a result, no recess is formed, and leakage current is avoided.

12 Claims, 3 Drawing Sheets

METHOD FOR FORMING A BORDERLESS CONTACT

BACKGROUND OF THE INVENTION

1. Field of the Invention

The present invention relates to a method for forming a semiconductor device. More particularly, the present invention relates to a method for forming a borderless contact.

2. Description of the Related Art

As semiconductor device integration continuously increases, device dimensions are necessarily accordingly reduced. Since the size of the semiconductor device is gradually reduced, misalignment easily occurs during the semiconductor manufacturing processes.

FIG. 1 is a schematic, cross-sectional view showing an occurrence of misalignment while forming a contact window. As shown in FIG. 1, a shallow trench isolation (STI) structure 105 is formed in a substrate 100, and then a gate 110 is formed on the substrate 100. Preferably, a cap layer 112 is formed on a top surface of the gate 110. Spacers 130, made of silicon nitride, are formed on sidewalls of the gate and the cap layer 112, and source/drain regions 115 are formed on both sides of the gate 110 in the substrate 100. The detailed description of the processes mentioned above are omitted herein because the processes are well known to those skilled in the art.

A planarized silicon oxide layer 150 is formed on the substrate 100, and then a contact window 160 penetrating through the silicon oxide layer 150 is form by photolithography and etching to expose the source/drain regions 115. The contact window 160 can be used as a bitline contact window or a node contact window.

In the above manufacturing process for forming a contact window, the spacing prepared for forming the contact window 160 is small. Misalignment easily occurs while forming the contact window 160. Since the silicon oxide layer 150 and the shallow trench isolation structure 105 are both made of silicon oxide, a portion of the shallow trench isolation structure 105 is also etched due to misalignment. A recess 165, as illustrated in FIG. 1, is easily formed in the shallow trench isolation structure 105 when misalignment occurs. The recess 165 induces some problems, such as leakage current.

In order to avoid the leakage current mentioned above, a borderless contact technology is developed. The borderless contact for which the conductive line width is substantially the same as the contact window width used in current semiconductor fabrication process. As semiconductors enter the deep sub-micron stage, the device dimensions are gradually decreased to effectively raise the operating speed of the entire integrated circuitry. The borderless contact window process is one of the contact window manufacturing processes developed for the high density semiconductor devices.

FIGS. 2A through 2B are schematic, cross-sectional views of a method for forming a borderless contact window. Referring to FIG. 2A, a shallow trench isolation structure 105 is formed in a substrate 100, and a gate 110 is formed on the substrate 100. A roof layer 120 and spacers 130 are formed above and on the sides of the gate 110 respectively. Source/drain regions 115 are formed in the substrate 100.

A conformal silicon nitride cap layer 140 and a planarized silicon oxide layer 150 are sequentially deposited on the substrate 100. The silicon nitride cap layer 140 serves as a stop layer, and photolithography and etching processes are then conducted to form a borderless contact window 160 in the silicon oxide layer 150 above the source/drain regions 115. The borderless contact window 160 is, for example, a bitline contact window or a node contact window.

Referring to FIG. 2B, the silicon nitride cap layer 140 at the bottom of the borderless contact window 160 is removed by hot phosphoric acid to expose the source/drain regions 115.

In the above manufacturing process of forming a borderless contact window, the spacing prepared for forming the borderless contact window 160 is still small, and the borderless contact window 160 is formed at the interface between the source/drain regions 115 and the shallow trench isolation structure 105. The silicon nitride cap layer 140 can protect the shallow trench isolation structure 105 during the etching process; thus, no recess is formed, and leakage current is avoided.

However, the silicon nitride cap layer 140 formed on the substrate 100 induces stress in other regions of the device. As a result, the reliability of the device is decreased due to the stress.

FIGS. 3A through 3C are schematic, cross-sectional views of another method for forming a borderless contact window. Referring to FIG. 3A, a shallow trench isolation structure 205 is formed in a substrate 200, and then a gate 210 is formed on the substrate 200. Lightly doped source/drain regions 215 are formed on both sides of the gate 210 in the substrate 200. A conformal silicon nitride cap layer 220 is formed on the substrate 200. An ion implantation step 225 is then performed to form heavily doped source/drain regions 230 on both sides of the gate 210 in the substrate 200 while using the gate 210 and the silicon nitride cap layer 220 on sidewalls of the gate 210 as a mask. The lightly doped source/drain regions 215 and the heavily doped source/drain regions 230 constitute source/drain regions 235.

Referring to FIG. 3B, a planarized silicon oxide layer 240 is deposited over the substrate 200. The silicon nitride cap layer 220 serves as a stop layer, and photolithography and etching processes are then conducted to form a contact window 245 such as a bitline contact window or a node contact window in the silicon oxide layer 240 above the source/drain regions 235.

Referring to FIG. 3C, the silicon nitride cap layer 220 at the bottom of the contact window 245 is removed by hot phosphoric acid to expose the source/drain regions 235.

In the above method of forming a borderless contact window, the silicon nitride cap layer 220 serves as a buffer layer while forming the borderless contact window 245; thus, no recess is formed in the shallow trench isolation structure 205 and leakage current is avoided. However, the formation of the silicon nitride cap layer 220 is followed by the ion implantation step 225. It is difficult to perform the ion implantation step 225 because the silicon nitride cap layer 220 is hard; as a result, the device adjustment window is narrow.

SUMMARY OF THE INVENTION

Accordingly, the purpose of the present invention is to provide a method for forming a borderless contact. A silicon nitride layer, serving as an etching stop layer, is formed in a device isolation structure by ion implantation. The silicon nitride layer protects the shallow trench isolation structure and avoids leakage current.

The present invention provides a method for forming a borderless contact. A silicon nitride layer, serving as an etching stop layer, is formed in a device isolation structure by ion implantation. The silicon nitride layer can protect the shallow trench isolation structure and leakage current is avoided. Therefore, the reliability of the device is maintained, and the device adjustment window while performing the ion implantation process is widened.

To achieve these and other advantages and in accordance with the purpose of the invention, as embodied and broadly described herein, the invention provides a method for forming a borderless contact. A pad oxide and a mask layer are formed on a substrate in sequence. Photolithography and etching processes are performed, and then a trench is formed in the substrate. A first insulation layer is deposited over the substrate and fills the trench. Then, a portion of the first insulation layer is removed to form a device isolation structure. An ion implantation and a thermal process are performed on the device isolation structure to form a silicon nitride layer which is under a top surface of the device isolation structure. The mask layer and the pad oxide layer are removed, and then a gate is formed on the substrate. Spacers are formed on sidewalls of the gate, and source/drain regions are formed on both sides of the gate within the substrate. A second insulation layer is formed on the substrate. A portion of the second insulation layer is removed to expose the source/drain regions, and then an opening is formed. A conductive layer fills the opening to form a plug.

Because the material of the silicon nitride layer is different from the second insulation layer, the silicon nitride layer serves as an etching stop layer to protect the device isolation structure from overetching during the etching process. As a result, no recess is formed within the device isolation structure and leakage current is avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
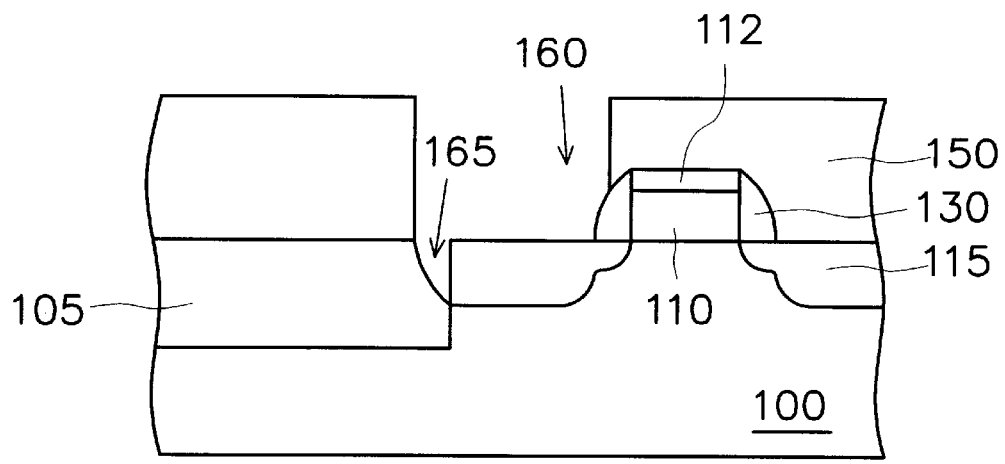
FIG. 1 is a schematic, cross-sectional view showing an occurrence of misalignment while forming a contact window.
Figure 2A:
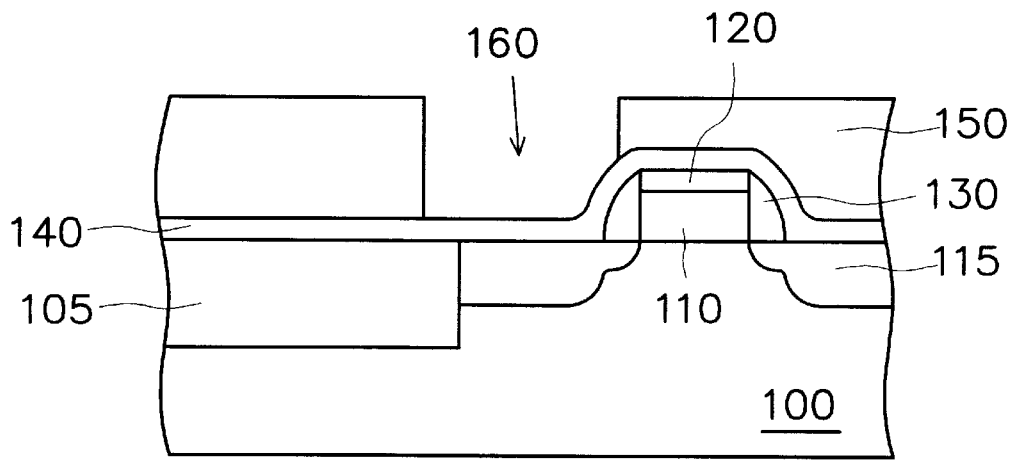
FIGS. 2A through 2B are schematic, cross-sectional views illustrating a method for forming a borderless contact window.
Figure 2B:
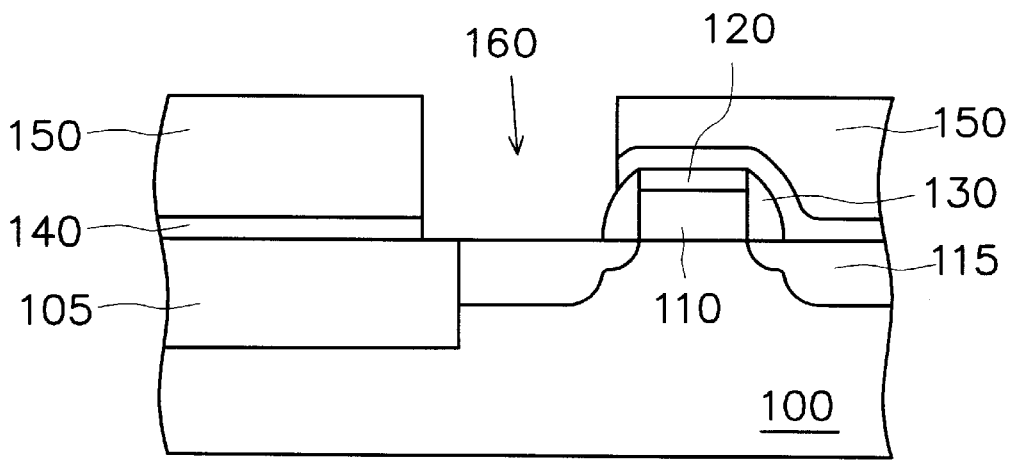
Figure 3A:
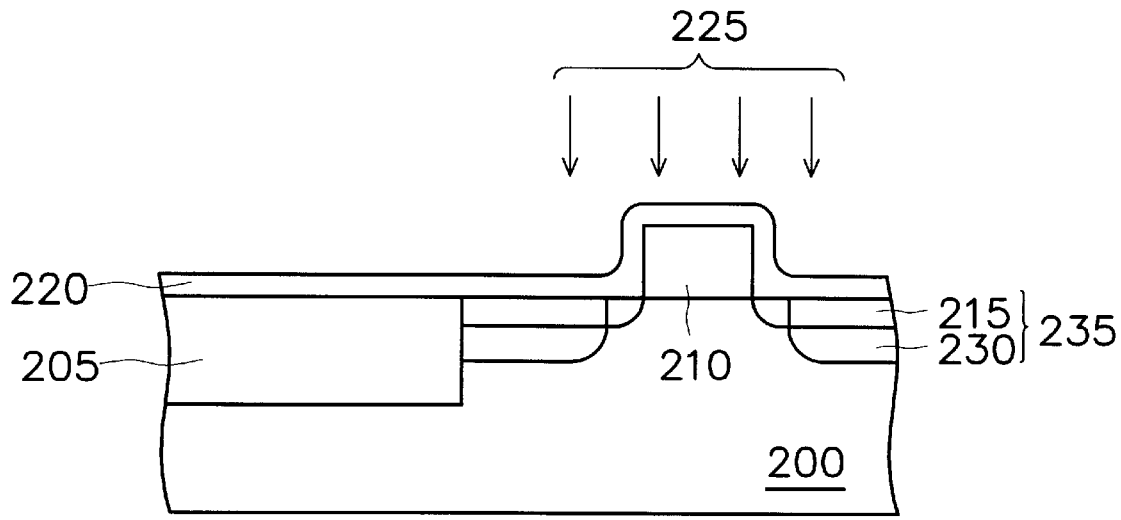
FIGS. 3A through 3C are schematic, cross-sectional views illustrating another method for forming a borderless contact window.
Figure 3B:
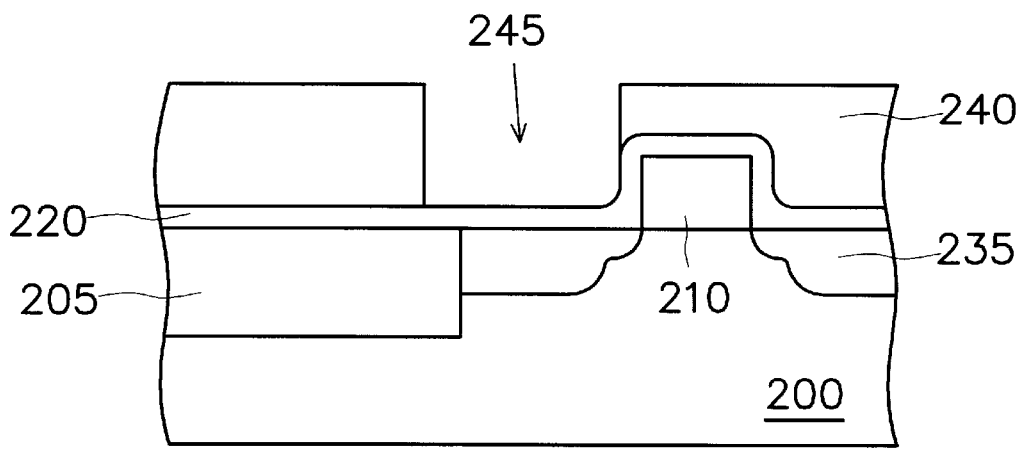
Figure 3C:
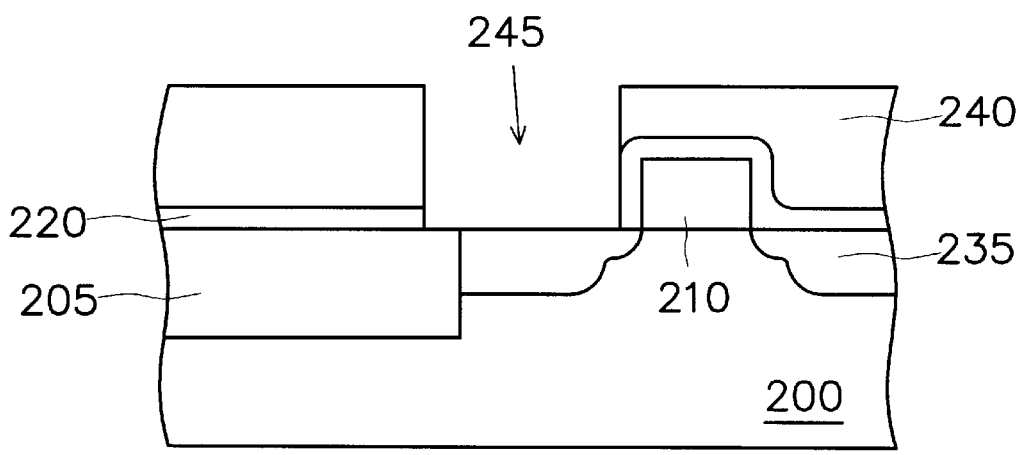

DESCRIPTION OF THE PREFERRED
EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 4A:
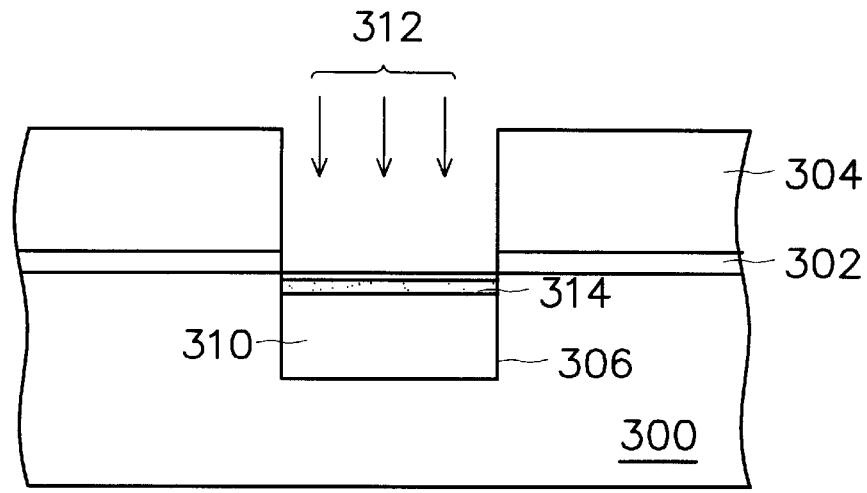
FIGS. 4A through 4C are schematic, cross-sectional views showing the progression of manufacturing steps for forming a borderless contact according to the preferred embodiment of this invention.
Figure 4B:
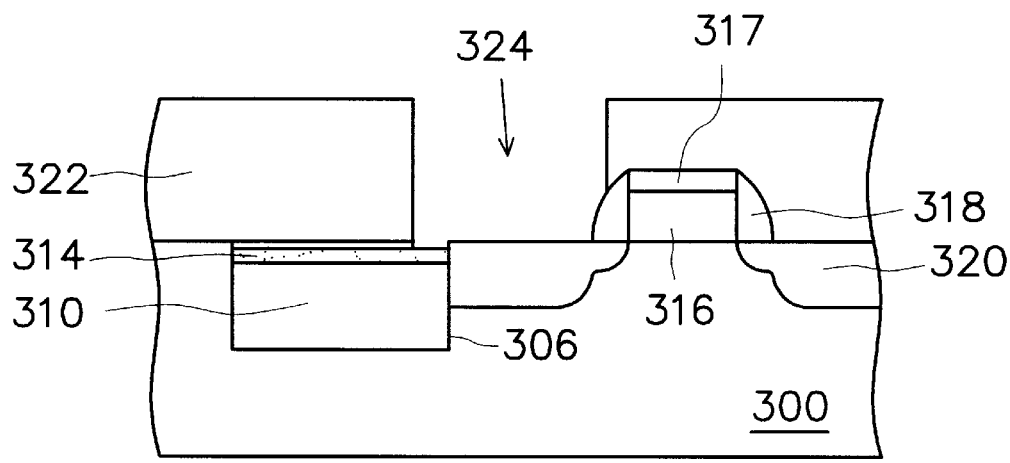
Figure 4C:
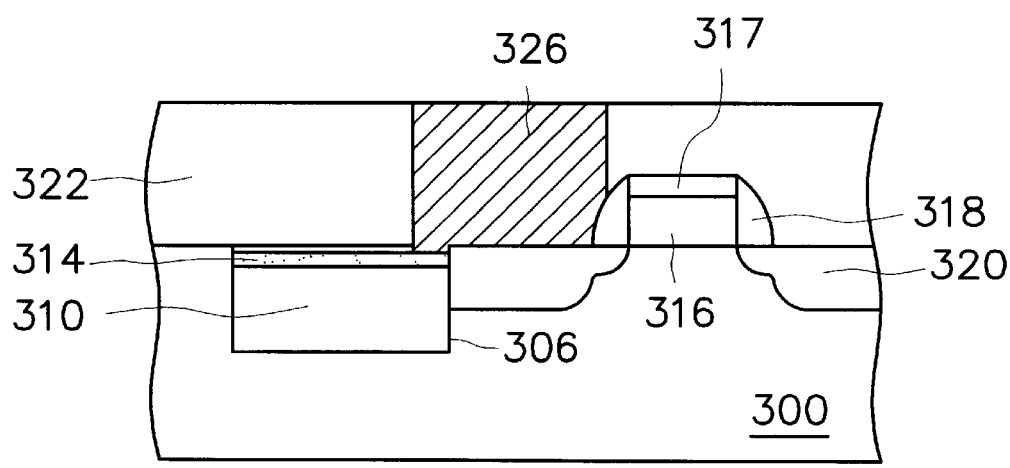

FIGS. 4A through 4C are schematic, cross-sectional views showing the progression of manufacturing steps for forming a borderless contact according to the preferred embodiment of this invention.

Referring to FIG. 4A, a pad oxide layer 302 and a mask layer 304 are formed on a substrate 300 in sequence. The mask layer 304 is made of a material such as silicon nitride. Photolithography and etching processes are performed to form a trench 306 in the substrate 300. An insulation layer (not shown) made of a material such as silicon dioxide is deposited over the substrate 300 and fills the trench 306. Then, a portion of the insulation layer is removed by etching back to form a device isolation structure 310 such as a shallow trench isolation structure.

An ion implantation process 312 and a thermal process are performed on the device isolation structure 310. A dopant implanted into the device isolation structure 310 is an ion such as $N_2^+$. $N_2^+$ reacts with silicon dioxide in the device isolation structure 310 to form a silicon nitride layer 314 under the top surface of the device isolation structure 310. The reaction is as follows:

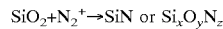

$$SiO_2 + N_2^+ \rightarrow SiN \text{ or } Si_xO_yN_z$$

Where the main product is silicon nitride (SiN). The thickness of the silicon nitride layer 314 is about 100–200Å. The dosage of $N_2^+$ is about 1E17 ions/com$^2$ and the implantation energy of $N_2^+$ is about 10–20 KeV. The thermal process is, for example, performed at about 1000° C., and the duration of the thermal process is about 1 hour.

As shown in FIG. 4B, the mask layer 304 and the pad oxide layer 302 are removed by, for example, an etching process. Then, a gate 316 is formed on the substrate 300, and a cap layer 317 is formed on a top surface of the gate 316. Spacers 318 are formed on sidewalls of the gate 316 and the cap layer 317, and source/drain regions 320 are formed in the substrate 300.

A planarized insulation layer 322 made of a material such as silicon oxide is formed on the substrate 300. The method of forming the planarized insulation layer 322 is as follows. First, a dielectric layer is formed, for example, by low pressure chemical vapor deposition (LPCVD) with tetraethylorthosilicate (TEOS) as a gas source or high density plasma chemical vapor deposition (HDPCVD). Then, the dielectric layer is planarized by chemical mechanical polishing (CMP).

The planarized insulation layer 322 is patterned by photolithography and etching processes to form an opening 324. The opening 324, such as a bitline contact window or a node contact window, penetrates through the planarized insulation layer 322 to expose the source/drain regions 320. When the planarized insulation layer 322 is made of silicon oxide, the opening 324 is formed, for example, by $CF_4$ plasma.

Because the silicon nitride layer 314 is formed under the top surface of the device isolation structure 310 and the material of the silicon nitride layer 314 is different from that of the insulation layer 322, the silicon nitride layer 314 serves as an etching stop layer to protect the device isolation structure 310 from overetching during the etching process. As a result, leakage current is avoided.

As shown in FIG. 4C, a conductive layer (not shown) is deposited on the insulation layer 322 and fills the opening 324, and then the conductive layer is planarized to form a plug 326 within the opening 324 by using the insulation layer 322 as a stop layer. The conductive layer such as doped polysilicon or polycide is formed by, for example, chemical vapor deposition (CVD).

In the invention, an ion implantation process and a thermal process are performed on the device isolation structure to form a silicon nitride layer. The silicon nitride layer is formed under the top surface of the device isolation structure. During the process of forming the borderless contact window, the silicon nitride layer can serve as an etching stop layer to protect the device isolation structure from overetching. As a result, leakage current is avoided.

In the invention, an ion implantation process and a thermal process are performed to form a silicon nitride layer within the device isolation structure. The silicon nitride layer can protect the shallow trench isolation structure while forming the borderless contact. Consequently, no recess is formed in the device isolation structure. Therefore, leakage current is avoided. In addition, the process window is widened. Furthermore, the reliability of the device is increased because no cap layer is formed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a borderless contact, wherein a substrate having a device isolation structure is provided, the method comprising the steps of:

performing an ion implantation and a thermal process to form an etching stop layer within the device isolation structure;

forming a gate on the substrate, wherein spacers are formed on sidewalls of the gate and source/drain regions are formed in the substrate;

forming an insulation layer on the substrate;

forming an opening penetrating through the insulation layer to expose the source/drain regions, wherein the etching stop layer protects the device isolation structure from overetching when misalignment occurs; and forming a plug within the opening.

2. The method of claim 1, wherein a dopant of the ion implantation process includes $N_2^+$.

3. The method of claim 1, wherein the device isolation structure includes silicon oxide.

4. The method of claim 1, wherein the etching stop layer includes silicon nitride.

5. The method of claim 4, wherein the silicon nitride layer is formed by a reaction of silicon dioxide and the dopant.

6. The method of claim 1, wherein a dosage of the dopant is about 1E17 ions/com$^2$ and an implantation energy of the dopant is about 10–20 KeV.

7. The method of claim 1, wherein the thermal process is performed for about 1 hour at a temperature of about 1000° C.

8. A method for forming a borderless contact, the method comprising the steps of:

providing a substrate having a device isolation structure;

performing a $N_2^+$ implantation process and a thermal process to form a silicon nitride layer under a top surface of the device isolation structure;

forming a gate on the substrate, wherein spacers are formed on sidewalls of the gate and source/drain regions are formed in the substrate;

forming a planarized insulation layer on the substrate;

removing a portion of the planarized insulation layer to form an opening, wherein the opening exposes the source/drain regions and the silicon nitride layer protects the device isolation structure from overetching when misalignment occurs; and forming a plug within the opening.

9. The method of claim 8, wherein materials of the insulation layer and the device isolation structure are different from a material of the silicon nitride layer.

10. The method of claim 8, wherein a thickness of the silicon nitride layer is about 100–200Å.

11. The method of claim 8, wherein a dosage of $N_2^+$ is about 1E17 ions/com$^2$ and an implantation energy of $N_2^+$ is about 10–20 KeV.

12. The method of claim 8, wherein the thermal process is performed for about 1 hour at a temperature of about 1000° C.

* * * * *